(12) United States Patent
Szu

(10) Patent No.: US 7,351,087 B2
(45) Date of Patent: Apr. 1, 2008

(54) LAND GRID ARRAY PACKAGE SOCKET

(75) Inventor: Ming-Lun Szu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 361 days.

(21) Appl. No.: 11/224,182

(22) Filed: Sep. 12, 2005

(65) Prior Publication Data

US 2006/0057878 A1 Mar. 16, 2006

(30) Foreign Application Priority Data

Sep. 10, 2004 (TW) .............................. 93214476 U

(51) Int. Cl.
*H01R 13/625* (2006.01)
(52) U.S. Cl. ..................................... 439/342
(58) Field of Classification Search ................ 439/342, 439/341, 331, 259, 73, 343, 261
See application file for complete search history.

(56) References Cited

U.S. PATENT DOCUMENTS

| | | | | |
|---|---|---|---|---|
| 7,029,309 B2* | 4/2006 | Ma | ............................ | 439/331 |
| 7,059,863 B2* | 6/2006 | Ma | ............................ | 439/41 |
| 7,083,457 B2* | 8/2006 | Ma | ............................ | 439/331 |
| 7,101,210 B2* | 9/2006 | Lin et al. | ..................... | 439/331 |
| 7,112,068 B2* | 9/2006 | Ma | ............................ | 439/71 |
| 7,121,844 B2* | 10/2006 | Ma | ............................ | 439/73 |
| 7,128,593 B2* | 10/2006 | Ma | ............................ | 439/331 |
| 7,134,898 B2* | 11/2006 | Ma | ............................ | 439/342 |
| 7,153,154 B2* | 12/2006 | Ma et al. | ..................... | 439/331 |
| 7,207,822 B2* | 4/2007 | Szu | ............................ | 439/342 |

* cited by examiner

*Primary Examiner*—Chandrika Prasad
(74) *Attorney, Agent, or Firm*—Wei Te Chung

(57) ABSTRACT

Disclosed is an LGA socket (1) including a socket body (10) having a number of terminals (11) embedded therein. A stiffener (12) is bottomed to the socket body. A load plate (14) and a load lever (15) are pivotally assembled to two opposite ends of the stiffener. At least one of the stiffener and the load plate is formed to have a lateral-opened hollow frame by stamp of an elongated strip of metal.

12 Claims, 5 Drawing Sheets

LAND GRID ARRAY PACKAGE SOCKET

BACKGROUND OF THE INVENTION

1. Field of the Invention

The present invention generally relates to electrical connectors and, more particularly, to a land grid array (LGA) socket to provide electrical connection between an LGA package and an electrical substrate, such as a printed circuit board (PCB).

2. Background of the Invention

Various types of conventional electrical connectors for attaching IC packages are known. Each of the IC packages has a large number of contacts arranged in an array of rows and columns. The IC packages are generally classified as pin grid array (PGA) packages, ball grid array (BGA) packages, or land grid array (LGA) packages, depending on shapes of an electric contact portion of the contacts.

Because of the widely used LGA packages, many LGA sockets have been developed to electrically connect the contacts of the IC packages with terminals of the corresponding LGA sockets. A typical LGA socket includes a socket body, in a rectangular shape, and a plurality of electrical terminals assembled on the socket body. A set of retention members is provided to retain the IC package in the socket body so as to establish electrical connection therebetween. To comply with the rectangular socket body, some of the retention members, such as a cover member or a reinforcing plate, are required to have a generally rectangular hollow frame. The hollow frame is provided with a large central rectangular through-hole, which is adapted for receiving the socket body therein.

However, in manufacturing, an abundant of material may be often removed and thereby wasted, because each of these rectangular members is formed by punching of a sheet of metal into the central through-hole frame. This will directly result in much more additional costs to the overall manufacturing of the LGA socket.

In view of the above, it is desired to provide a new LGA socket which overcomes the above-mentioned disadvantages.

SUMMARY OF THE INVENTION

LGA sockets according to preferred embodiments of the present invention are provided with lateral-opened hollow frames for some rectangular frame-like members of the LGA sockets, especially a metallic load plate or a stiffener.

The lateral-opened hollow frame is preferably formed by stamping an elongated strip of metal, and bending into the lateral-opened hollow frame. Alternatively, a plurality of sidewalls may be configured to form the lateral-opened hollow frame.

Due to such formation of the frame-like members, no material is removed and wasted, as opposed to the conventional formation of the load plate and the stiffener. Thus, additional cost associated with the LGA sockets is increasingly reduced.

Other features and advantages of the present invention will become more apparent to those skilled in the art upon examination of the following drawings and detailed description of preferred embodiments, in which:

DETAILED DESCRIPTION OF PREFERRED EMBODIMENTS

Figure 1:
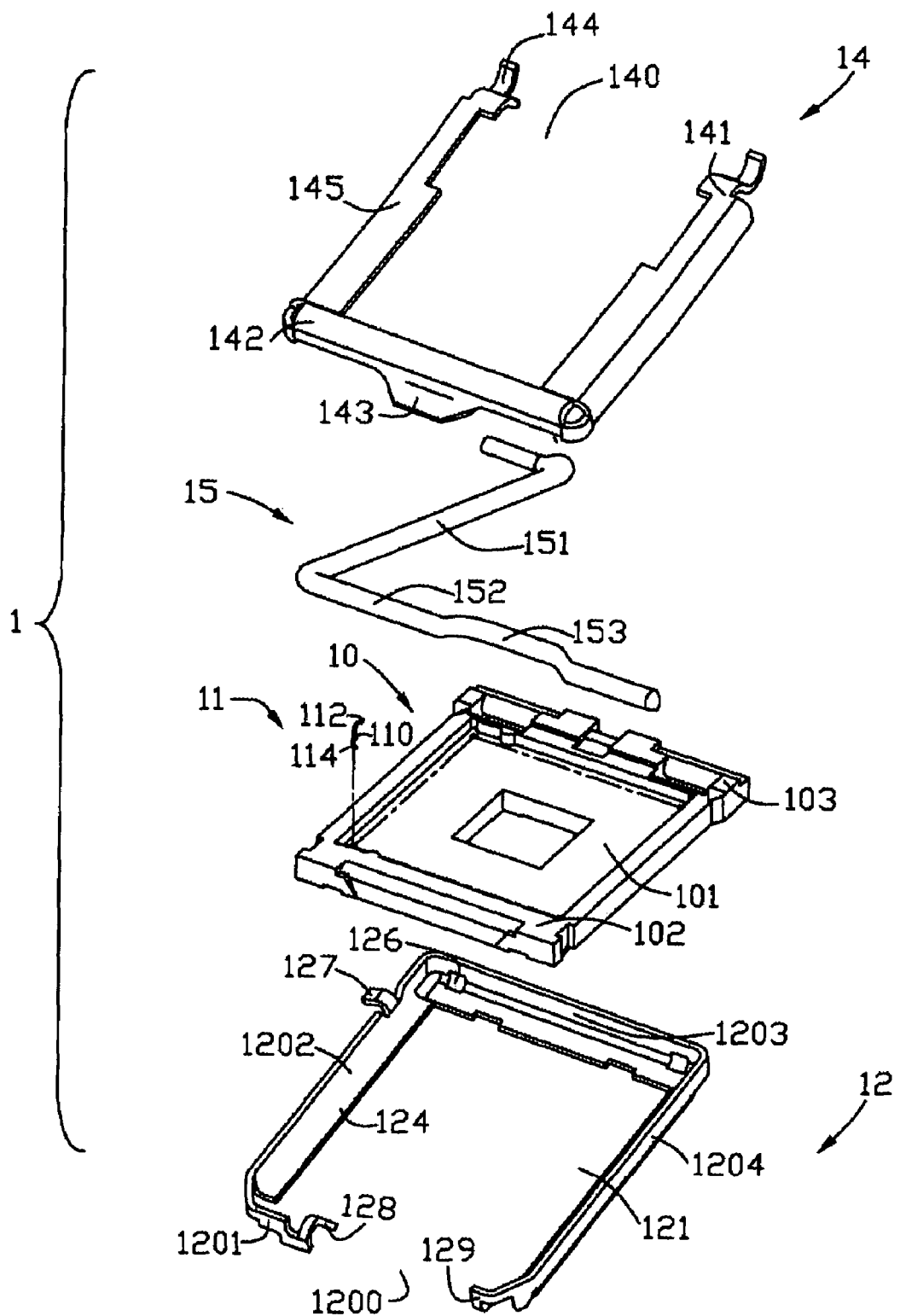
FIG. 1 is an exploded, isometric view of an LGA socket in accordance with a preferred embodiment of the present invention.
Figure 2:
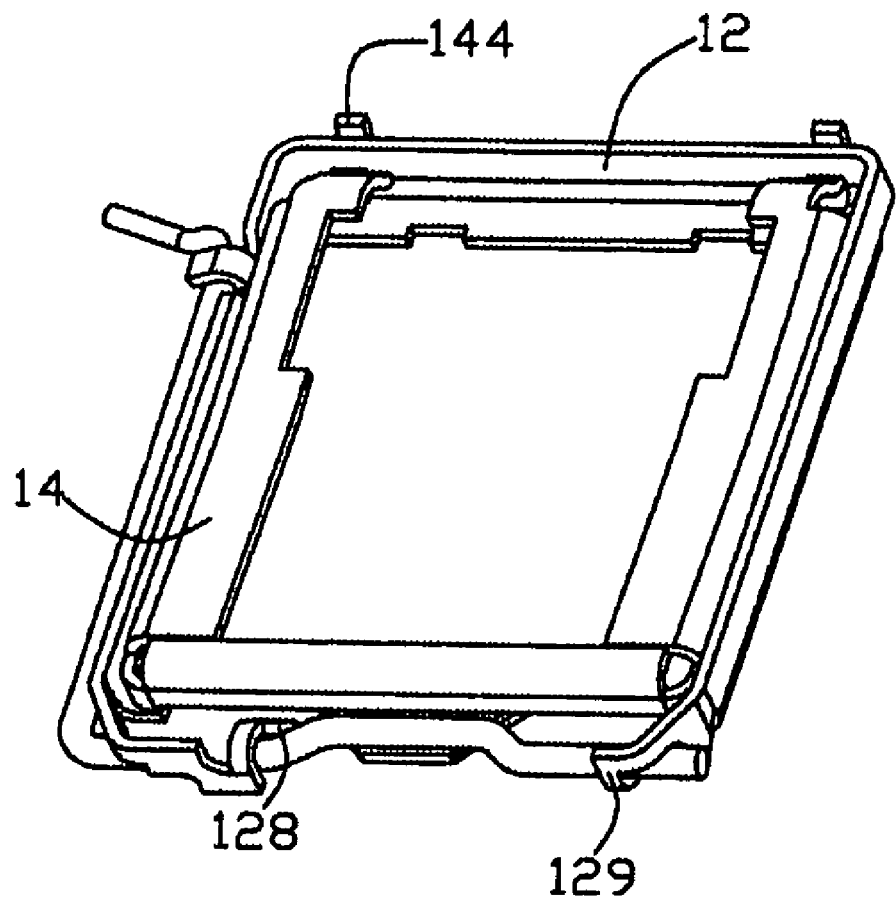
FIG. 2 is an assembled, isometric view of a part of the LGA socket of FIG. 1, not showing a socket body therein.
Figure 3:
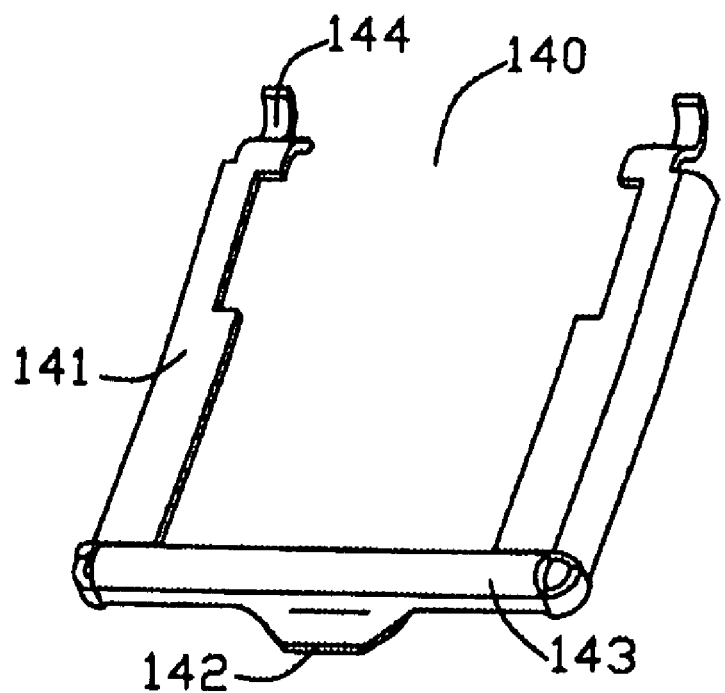
FIG. 3 is an isometric view of a load plate of the LGA socket of FIG. 1.
Figure 4:
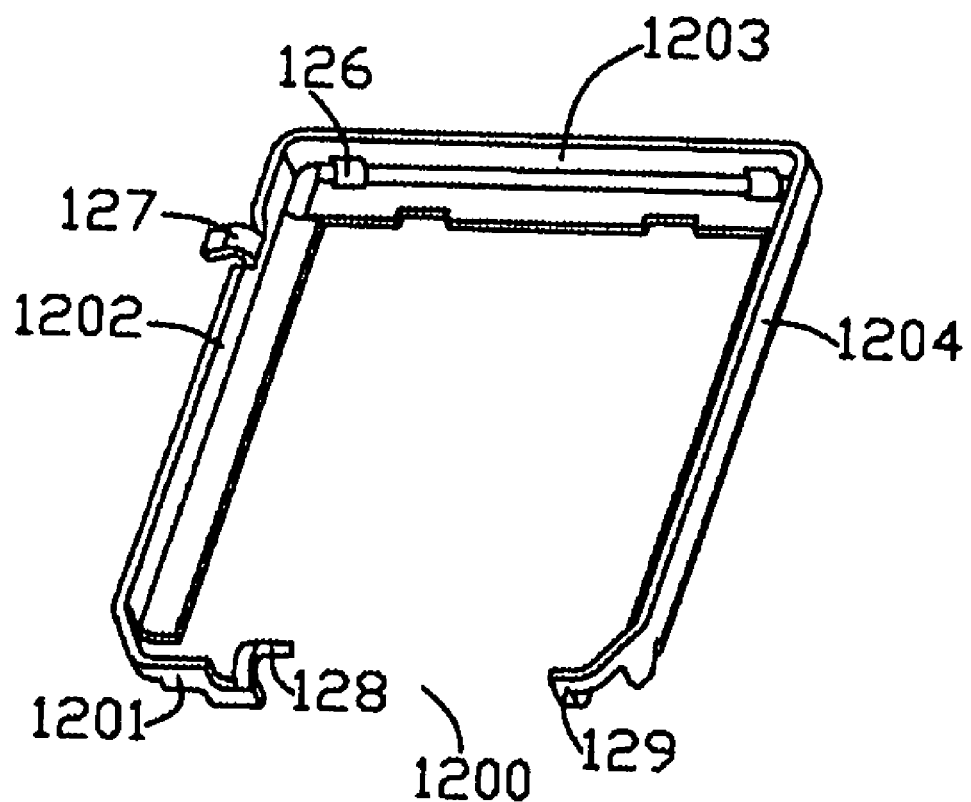
FIG. 4 is an isometric view of a stiffener of the LGA socket of FIG. 1.

Reference will now be made to describe preferred embodiments of the present invention in detail.

Referring to FIGS. 1 to 5, an LGA socket 1 according to a preferred embodiment of the present invention is shown to establish electrical connection between an LGA package (not shown) and a circuit substrate (not shown) mounting on the LGA socket 1.

The socket 1 includes a simplified socket body 10 embedded with a plurality of terminals 11. A stiffener 12 is attached to a bottom surface of the socket body 10. A load plate 14 is pivotally mounted on a first end of the stiffener 12. A load lever 15 is pivotally supported on an opposite second end of the stiffener 12. The load lever 15 engages with a free end of the load plate 14 to lock the load plate 14 in a closed position, where the load plate 14 presses the LGA package toward the socket body 10 to bring the LGA package into contact with the terminals 11 of the socket 1. Thus, through the socket 1, electrical connection is established between the IC package and the circuit substrate via the LGA socket 1.

The socket body 10 is made of insulative material, and shaped in the form of a generally rectangular frame. An upper section of the socket body 10 has an receiving region 101 defined between a front part 102 and a rear part 103 of the socket body 10. The receiving region 101 includes a plurality of passageways (not shown) arranged in columns and rows, for receiving the respective terminals 11 therein. It should be noted that, while the socket body 10 similar to the conventional socket body known in the art is preferred, but any socket body of somewhat different shape may be also employed.

Each of the terminals 11 generally includes a base section 110 secured in the corresponding passageway, an upwardly extending section 112 for electrically mating with a corresponding conductive pad of the LGA package, and a downwardly extending section 114 for electrical connection to a corresponding circuit pad of the substrate.

The stiffener 12 is substantially of a rectangular frame with thereof an off-cut or separated sidewall 1201 adjacent the front part 102 of the socket body 10. Preferably, the stiffener 12 is formed by stamping an elongated strip of metal, and then bending the strip into a lateral-opened hollow frame. Alternatively, in other embodiments, a plurality of sidewalls may be employed to form the lateral-opened frame by any other suitable machining means, such as welding or fastening means. Accordingly, the stiffener 12 so formed has a central through-hole 121 with a lateral off-cut opening 1200 defined by the sidewall 1201 thereof, without generation of wasted material. The central through-hole 121 is surrounded by the first sidewall 1201, a second sidewall 1202, a third sidewall 1203, a fourth sidewall 1204.

Preferably, the sidewalls 1202, 1203, 1204 are continuous, and curved downwards and bent inwards to cooperatively form a common supporting surface 124 to receive the socket body 10 therein. Preferably, a part of the supporting surface 124 adjacent the third sidewall 1203 is slightly wider than that of the other sidewalls 1202, 1204, so that the socket body 10 assembled therein can be mostly secured by that part of supporting surface 124. Opposite ends of the lateral opening 1200 of the first sidewall 1201 are respectively provided with a pair of retaining elements 128, 129, for cooperatively supporting at least part of the lever 15 inserted therefrom. The first element 128 is not structurally the same as the second element 129, but in reversed relationship with the second retaining element 129. That is, the downward-facing surface of the first retaining element 128 is concave and the upward-facing surface of the reversed retaining element 129 is convex, so as to prevent the interlocking portion 153 of the lever 15 to remove therefrom when the lever 15 is supported by the pair of retaining elements 128, 129. The second sidewall 1202 has an interlocking protrusion 127, for engaging with the actuating portion 151 of the lever 15. In additional, the third sidewall 1203 has a pair of spaced mounting slots 126, for engaging with the pair of bearing tongues 144 of the load plate 14, respectively.

The load lever 15 is generally formed by bending a single metallic wire and includes a pair of spaced rotary shafts 152, which are partially supported by portions of the first sidewall 1201. An interlocking portion 153 is disposed between the rotary shafts 152, and is displaced relative to the rotary shafts 152, for locking the load plate 14 in the closed position. An actuating portion 151 for rotating the rotary shafts 152 is bent to be at a right angle with respect to the rotary shafts 152. A distal end of the actuating portion 151 is formed with a finger-like shape in order to form a handle 154 for ease of actuation.

The load plate 14 is also configured to have a generally rectangular hollow frame with a lateral off-cut opening 140 defined by a separated first sidewall 141 thereof. The formation of the load plate 14 is preferably similar to that of the stiffener 12, but the opening 140 is facing in opposed relationship with the opening 1200 of the stiffener 12. Therefore, no additional material is wasted during manufacturing of the load plate 14.

The first sidewall 141 has a curved surface shaped to engage with the third sidewall 1203 of the stiffener 12, in order to be pivotally movable between an opened position (to be hereinafter described) and the closed position. A pair of spaced bearing tongues 144 projects from portions of the first sidewall 141 adjacent opposite ends of the opening 140 respectively, and is further curved upwards so as to engage with the corresponding mounting slots 126 of the stiffener 12. A second sidewall 142 opposite the first sidewall 141 is formed with a downwardly curved locking section 143, for engaging with the interlocking portion 153 of the lever 15. Additionally, side edges 145 between the first sidewall 141 and the second sidewall 142 are bent slightly downward in the middle portions thereof, in order to engage with the upper surface of the LGA package inserted into the socket body 10.

Figure 5:
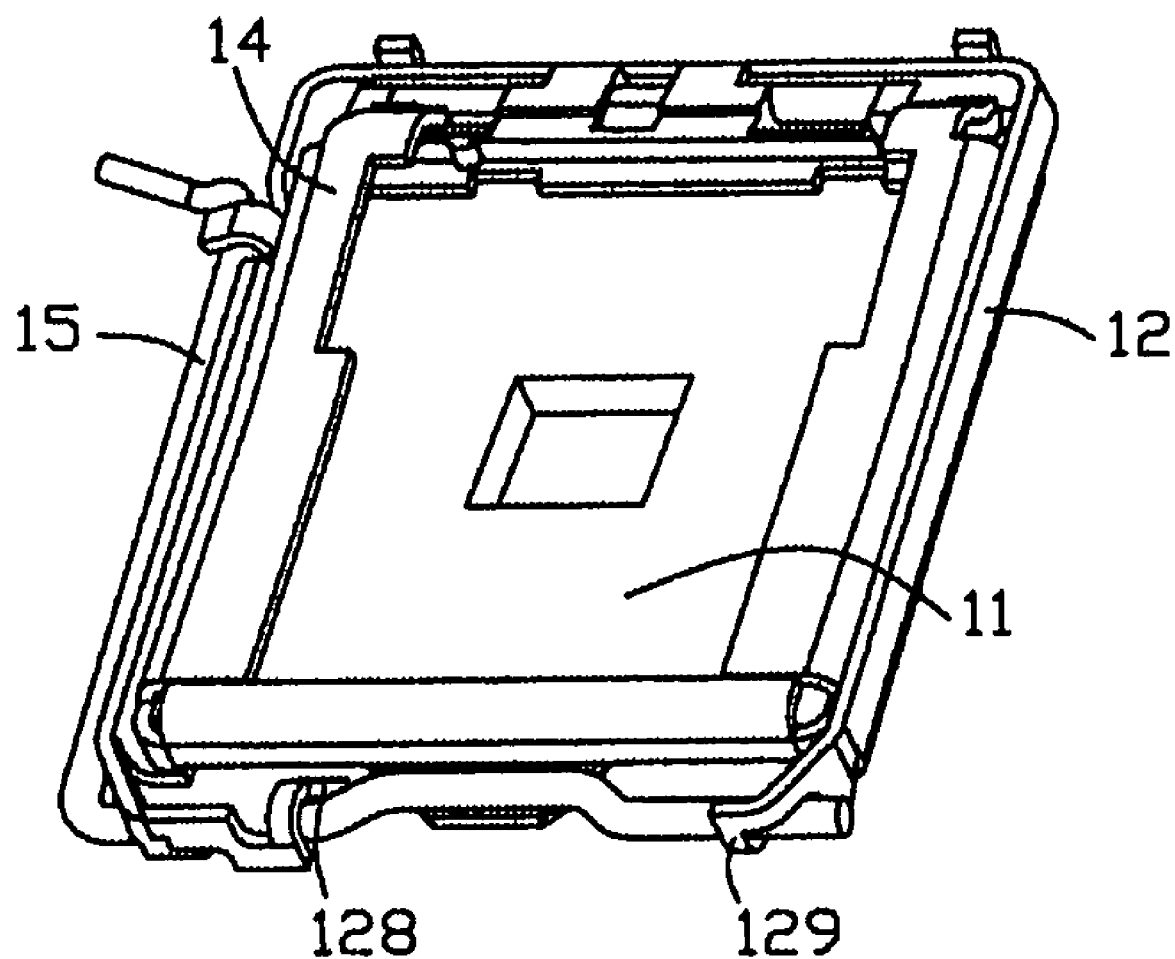
FIG. 5 is an assembled, isometric view of the LGA socket of FIG. 1, but showing the socket body therein.

Referring to FIGS. 1 and 5, in assembly, the bearing tongues 144 of the load plate 14 are inserted to engage with the mounting slots 126 of the stiffener 12 respectively, so that the load plate 14 is pivotally movable between the opened position and the closed position by engagement of the tongues 144 and the slots 126. The lever 15 is assembled into the first sidewall 1201 of the stiffener 12 by the pair of retaining elements 128, 129 that cooperatively support part of the lever 15. Then, the socket body 10 embedded with terminals 11 is loaded into the stiffener 12, and retained by the supporting surface 124 around the central through hole 121 of the stiffener 12. In that position, a receptacle between the first sidewall 1201 and the front part edge of the socket body 10 is thereby remained to receive the interlocking portion 153 of the lever 15. It should be noted that, while the above assembly illustrated is preferred, any other possible assembly may also be employed herein.

In operation, the actuating portion 151 of the load lever 15 is released so as to enable the lever interlocking portion 153 to be disengaged from the locking portion 143 of the load plate 14. When the load plate 14 is placed in an opened position, the LGA package is loaded to be resided within the receiving region 101 of the socket body 10. The load plate 14 is pivoted to the closed position, and the actuating portion 151 is driven to lower the interlocking portion 153 so as to permit the load plate 14 to press the LGA package toward the socket body 10 to cause electrical connection between pads of the IC package and terminals 11 of the socket body 10.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An LGA socket assembly for electrically connecting an LGA package, the LGA socket assembly comprising:
    a socket body having a plurality of terminals thereon;
    a stiffener disposed around the socket body, the stiffener defining a first end and an opposite second end thereof;
    a load plate pivotally mounted on the first end of the stiffener, the load plate being pivotal between an opened position and a closed position where the load plate presses the LGA package toward the socket body so that the LGA package electrically mates with the terminals; and
    a load lever pivotally supported on the second end of the stiffener for locking the load plate in the closed position;
    wherein, at least one of the stiffener and the load plate has a separated first sidewall thereof, a retaining mechanism is provided at a position adjacent the separated sidewall for pivotal connection.

2. The LGA socket assembly as claimed in claim 1, wherein the at least one of the stiffener and the load plate has a remainder of integral peripheral sidewalls.

3. The LGA socket assembly as claimed in claim 1, wherein the at least one of the stiffener and the load plate has integral peripheral sidewalls including the separated sidewall thereof.

4. The LGA socket assembly as claimed in claim 1, wherein an off-cut opening is defined on the separated first sidewall, the retaining mechanic comprises a pair of retaining elements respectively disposed adjacent opposite ends of the off-cut opening.

5. The LGA socket assembly as claimed in claim 1, wherein the stiffener has an off-cut opening defined on the separated first sidewall thereof, the retaining mechanic comprises a pair of structurally different retaining elements, the pair of retaining elements being disposed adjacent opposite ends of the off-cut opening to cooperatively support the load lever for pivotal connection.

6. The LGA socket assembly as claimed in claim 1, the plate comprising a plurality of sidewalls configured to form a lateral-opened hollow frame.

7. The LGA socket assembly as claimed in claim 6, wherein the plurality of sidewall is integral.

8. The LGA socket assembly as claimed in claim 6, wherein the plate has a lateral opening defined by the lateral-opened frame, a pair of structurally different holding portions being disposed adjacent opposite ends of the lateral opening for connection with the LGA socket.

9. The LGA socket assembly as claimed in claim 6, wherein the side wall includes a vertical section and a horizontal section linked to a horizontal edge of said vertical section, said vertical sections of two adjacent side walls being originally essentially aligned and coplanar with each other while being successively bent to final configurations essentially perpendicular to each other.

10. The LGA socket assembly as claimed in claim 9, wherein the horizontal sections of the adjacent two side walls are not integrally connected with each other at a corresponding confrontation corner.

11. The LGA socket assembly as claimed in claim 6, wherein said frame-like plate is essentially attached to a bottom portion of a housing of the socket in which contacts are disposed.

12. The LGA socket assembly as claimed in claim 6, wherein said frame-like plate is a pivotally moveable load plate for downwardly pressing an electronic package which is position in the socket and sandwiched between the frame-like plate and the socket.

* * * * *